United States Patent
Chovino et al.

(10) Patent No.: US 7,789,964 B2
(45) Date of Patent: Sep. 7, 2010

(54) METHOD FOR CLEANING A SURFACE OF A PHOTOMASK

(75) Inventors: Christian Chovino, Dresden (DE); Matthew Lamantia, Dresden (DE)

(73) Assignee: Advanced Mask Technology Center GmbH & Co. KG (DE)

( * ) Notice: Subject to any disclaimer, the term of this patent is extended or adjusted under 35 U.S.C. 154(b) by 551 days.

(21) Appl. No.: 11/584,156

(22) Filed: Oct. 20, 2006

(65) Prior Publication Data

US 2007/0113866 A1 May 24, 2007

(30) Foreign Application Priority Data

Oct. 21, 2005 (EP) .................................. 05109839

(51) Int. Cl.
*B08B 7/00* (2006.01)
(52) U.S. Cl. ................ 134/1; 134/30; 134/42; 117/84
(58) Field of Classification Search ............ 134/34, 134/42, 1, 21, 30; 117/84
See application file for complete search history.

(56) References Cited

U.S. PATENT DOCUMENTS

| | | | |
|---|---|---|---|
| 6,475,277 B1* | 11/2002 | Hirota et al. ............ | 117/106 |
| 6,764,552 B1 | 7/2004 | Joyce et al. | |
| 2003/0047195 A1 | 3/2003 | DeYoung et al. | |
| 2004/0144399 A1 | 7/2004 | McDermott et al. | |
| 2006/0002433 A1* | 1/2006 | Huang et al. ............ | 372/6 |
| 2007/0020872 A1* | 1/2007 | Shindo et al. ........... | 438/406 |

FOREIGN PATENT DOCUMENTS

| EP | 05109839.0 | 10/2005 |
|---|---|---|
| WO | WO 2004049063 A2 * | 6/2004 |

OTHER PUBLICATIONS

Improving Photomask surface properties though a combination of dry and wet cleaning steps. Eschbach, et al. Proceedings of SPIE, vol. 5446, Apr. 2004. pp. 209-217.*

"ArF lithography reticle crystal growth contributing factors," 24th Annual BACUS Symposium on Photomask Technology, Florence Eschbach, et al., Proceedings of SPIE vol. 5567, pp. 497-505, Sep. 14, 2004.

(Continued)

*Primary Examiner*—Michael Kornakov
*Assistant Examiner*—Naomi Birbach
(74) *Attorney, Agent, or Firm*—Mayback & Hoffman, P.A.; Gregory L. Mayback; Rebecca A. Tie

(57) ABSTRACT

A method of cleaning a surface of a photomask by removing contaminants from its surface that includes placing the photomask in a vessel, which is held under an elevated pressure and feeding a supercritical fluid, in particular, $CO_2$ in a supercritical state, to the vessel. An additive, such as alcohol, water ketones, esters, surfactants, and organic solvents, can be added to the fluid. The vessel can be held under a pressure higher than the critical pressure of the fluid and at a temperature higher than the critical temperature of the fluid.

17 Claims, 4 Drawing Sheets

OTHER PUBLICATIONS

"Root cause analysis for crystal growth at ArF excimer laser lithography," Photomask and Next-Generation Lithography Mask Technology XI, Hiroyuki Ishii, et al., Proceedings of SPIE vol. 5446, No. 1, 2004, pp. 281-224.

"193nm Haze Contamination: A Close Relationship between Mask and its Environment," Eric V. Johnstone, et al., 23rd Annual BACUS Symposium on Photomask Technology, Proceedings of SPIE vol. 5256.

"Cleaning of photomask substrates using $CO_2$ snow," Werner V. Brandt, Eco-Snow Systems, Inc., Proceedings of SPIE vol. 4567, p. 600-608, Mar. 2002.

* cited by examiner

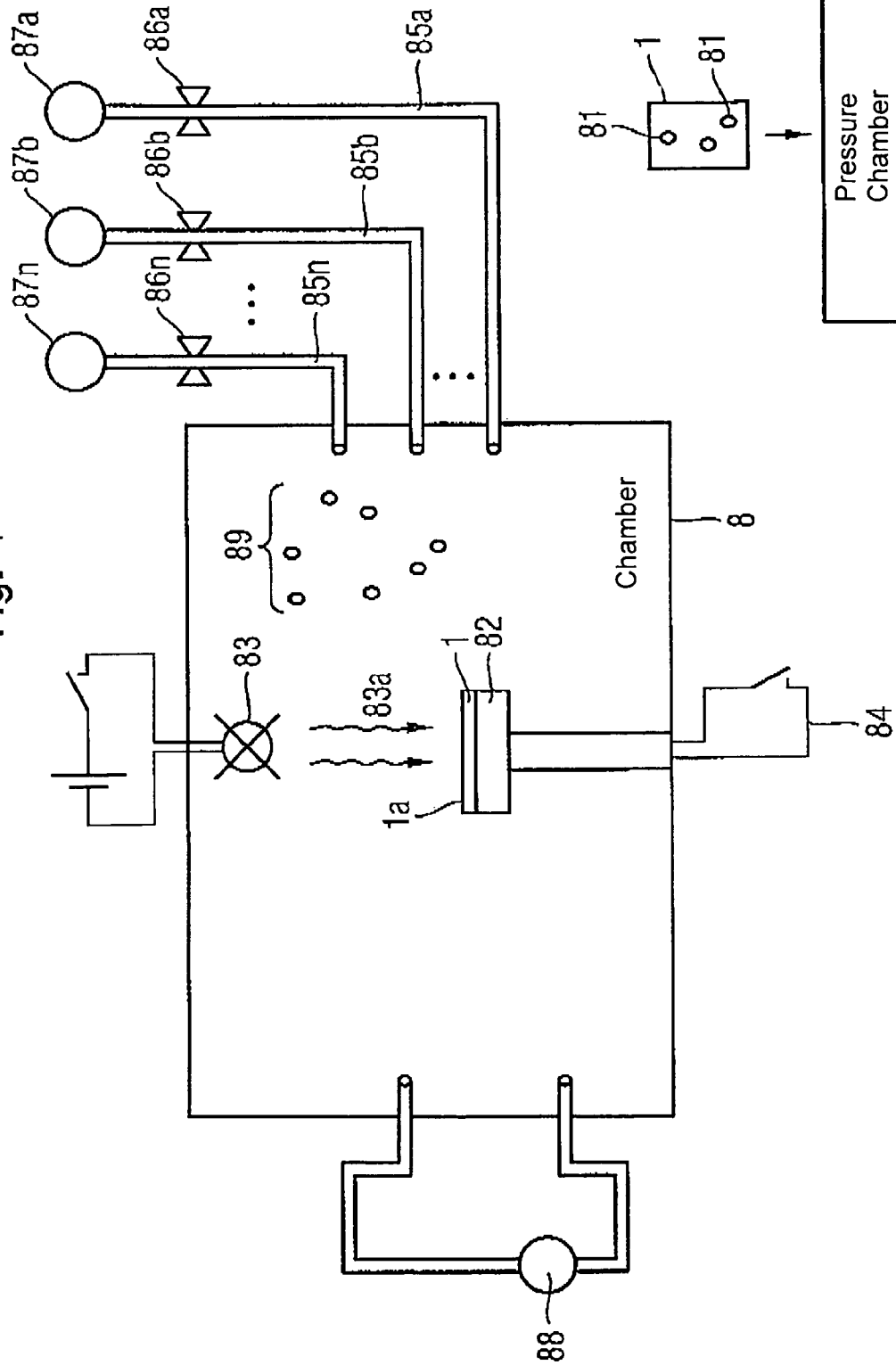

METHOD FOR CLEANING A SURFACE OF A PHOTOMASK

CROSS-REFERENCE TO RELATED APPLICATIONS

This application claims the priority, under 35 U.S.C. §119, of EP patent application No. 05 109 839.0, filed Oct. 21, 2005; the prior application is herewith incorporated by reference in its entirety.

BACKGROUND OF THE INVENTION

FIELD OF THE INVENTION

The present invention relates to a method of cleaning a surface of a photomask. Such a photomask is commonly used for photolithographically patterning surfaces in the field of semiconductor technologies.

During the manufacture of a semiconductor device, components of the device usually are formed by patterning layers that are deposited on a silicon wafer. The patterning of these layers is accomplished by applying a resist material onto the layer that has to be patterned and by subsequently exposing predetermined portions of the resist layer, which is sensitive to the exposure wavelength. Thereafter, the regions that have been irradiated with the radiation (or not) are developed and the irradiated or radiated portions are subsequently removed. As a consequence, portions of the layer are masked by the generated photoresist pattern during a following process step, such as an etching step or an implantation step. After processing the exposed portions of the underlying layer, the resist mask is removed.

For patterning the resist layer, usually photolithographical masks (photomasks) or reticles are used for transferring a predetermined pattern onto the layer that is to be patterned. For example, a photomask, which can be used for optical lithography, includes a substrate made of a transparent material such as quartz glass, as well as a patterned layer that can be made of an opaque material, for example, a metal such as chromium. Alternatively, the patterned layer can be made of a phase-shifting semitransparent material such as molybdenum silicide (MoSi). In other known photomasks, the quartz substrate itself is patterned to provide a phase-shifting mask. In addition, part of the quartz substrate can be covered with a pattern made of a phase shifting layer. The patterned material results in a modulation of the intensity of the transmitted light. Due to the specific materials that constitute a photomask, photomasks are very sensitive.

In present technologies, patterns are transferred or imaged from the mask to the wafer by UV-lithography, wherein an exposure wavelength of 193 nm is commonly used. Although such an exposure is usually conducted in a clean room atmosphere, in which most of the reactant gases are removed by special filters, reactions occur on the surface of the reticle, leading to an unwanted crystal growth. In particular, photo-induced reactions of contaminants, which are present on the photomask surface, with environmental impurities lead to a crystal growth and haze on the surface of the photomask or reticle. To be more specific, the contaminants present on the photomask act as crystal seeds or crystal nuclei from which crystals grow.

For example, the contamination can be caused by the environment and, in particular, constituents of the air that are favorable to crystal growth on the mask surface. Moreover, contamination sources include mask residuals that are left from the mask patterning process, as well as residuals from chemicals that are used during the mask manufacturing process and residuals from cleaning steps (such as sulfuric acid, ammonia and others) and residuals from etching steps. As a consequence, for example, crystal growth will occur during the mask usage in the wafer fabrication facility, also referred to as a fab. As a result, the wafer production will be stopped and the reticle will be returned to the mask supplier. It will be necessary for the mask supplier to clean the photomask and, optionally, to apply a new pellicle onto the surface of the mask. Finally, the mask is used at the wafer fab until crystal growth will again occur.

W. Brandt, "Cleaning of photomask substrates using $CO_2$ snow", Proc. SPIE Vol. 4562, pp. 600-608, March 2002, discloses a method of cleaning photomask substrates using $CO_2$ snow, wherein $CO_2$ particles are used to mechanically clean the surface of a photomask.

Moreover, United States Patent Publication No. 2003/0047195 A1 discloses a method and an apparatus for cleaning a microelectronic substrate, such as a semiconductor wafer, using $CO_2$ in a supercritical state.

SUMMARY OF THE INVENTION

It is accordingly an object of the invention to provide a method for cleaning a surface of a photomask that overcomes the hereinafore-mentioned disadvantages of the heretofore-known devices and methods of this general type and that improves upon prior art methods for cleaning a surface of a photomask.

With the foregoing and other objects in view, there is provided, in accordance with the invention, a method of cleaning a surface of a photomask by bringing the photomask into contact with a fluid in a supercritical state.

In accordance with another mode of the invention, the fluid is $CO_2$.

As will be used herein after, the term "supercritical fluid" refers to a fluid that is, by definition, at a temperature greater than or equal to the critical temperature of the fluid and at a pressure greater than or equal to the critical pressure of the fluid. In particular, supercritical $CO_2$ can be taken as the supercritical fluid. As is generally known, the critical pressure of $CO_2$ is about 1,070 psi (pounds per square inch) (1,070 psi=7.386 MPa) and the critical temperature of $CO_2$ is about 31° C. Accordingly supercritical $CO_2$ is usually held at temperature above 32° C. and at pressures of 1,070 to 3,500 psi (7.386 MPa to 24.161 MPa).

Usually supercritical fluids have a low surface tension and, hence, a very high solvent power. Accordingly, they have excellent extraction properties and, consequently, can be advantageously taken for cleaning a photomask surface Due to the special construction of a photomask as has been described above, the layers that are formed on the surface of the photomask substrate are very sensitive with respect to cleaning agents. Accordingly, to avoid damage of the patterned layers of a photomask, cleaning methods have to be developed that are adapted to the sensitive materials of the photomasks.

During the cleaning method of the present invention, optionally, at least one additive selected from the group consisting of alcohol, in particular, Isopropyl Alcohol (IPA), water, ketones, esters, surfactants, organic solvents, and others can be added to the supercritical $CO_2$.

The use of supercritical $CO_2$ is advantageous because no residuals that could cause further contamination of the photomask surface will be left on the surface. Accordingly, the present invention provides a method in which the photomask surface can be cleaned thoroughly without leaving any unwanted residuals.

In accordance with an added mode of the invention, there are provided the steps of placing the photomask in a vessel held under a pressure elevated with respect to the environment and feeding the supercritical fluid to the vessel.

In accordance with an additional mode of the invention, the fluid has a critical pressure and the vessel is held under a pressure higher than the critical pressure of the fluid.

In accordance with yet another mode of the invention, the fluid has critical temperature and the atmosphere of the vessel is held at a temperature higher than the critical temperature of the fluid.

With the objects of the invention in view, there is also provided a method of cleaning a crystal nucleus from a substrate surface, including the steps of setting environmental conditions to cause a relatively accelerated crystal growth from a crystal nucleus, the acceleration being with respect to crystal growth under standard clean room and air conditions, the environmental conditions being set by supplying energy inducing crystal growth and feeding at least one reactive gas at a relatively higher concentration than under standard clean room and air conditions, the reactive gas being a gas reacting with the crystal nucleus. The substrate surface is exposed to the environmental conditions to grow a crystal from the crystal nucleus. The grown crystal is removed from the substrate surface by bringing the substrate surface into contact with a fluid in a supercritical state.

In accordance with yet a further mode of the invention, the energy supplying step is carried out by irradiating with light.

In accordance with a further mode of the invention, the light irradiating step is carried out with ultraviolet light having a wavelength in a range between approximately 100 nm and approximately 400 nm.

According to a preferred embodiment of the present invention, supercritical $CO_2$ is used for rinsing the surface of the photomask, after exposure thereof with a UV lamp, or cleaning the surface of the photomask from the residuals and constituents susceptible to generate haze and crystal growth. Accordingly, due to the high solvent power of supercritical $CO_2$, any crystals that have grown during the exposure with the UV lamp will be removed thoroughly to efficiently clean the photomask surface.

In accordance with yet an added mode of the invention, the light irradiating step is carried out with infrared light having a wavelength of at least 800 nm and up to 1 mm.

In accordance with yet an additional mode of the invention, the gas feeding step is carried out with a reactive gas selected from the group consisting of ammonia, water vapor, hydrogen and oxygen.

In accordance with again another mode of the invention, the gas feeding step is carried out by feeding the reactive gas at a predetermined flow rate.

In accordance with again a further mode of the invention, an inert gas as a carrier gas is additionally fed to the substrate surface.

In accordance with again an added mode of the invention, the environmental conditions are set to be at a pressure below approximately $1.013 \times 10^5$ Pa.

In accordance with again an additional mode of the invention, the environmental conditions are set to be at a pressure between approximately 10 Pa and approximately $10^4$ Pa.

In accordance with still another mode of the invention, the grown crystal removing step is carried out by bringing the substrate surface into contact with $CO_2$ in a supercritical state.

In accordance with still a further mode of the invention, there is provided the step of adding to the fluid an additive of alcohol and/or water.

In accordance with still an added mode of the invention, during the grown crystal removing step, the substrate is placed in a vessel held under a pressure elevated with respect to the environment and feeding the fluid to the vessel.

In accordance with still an additional mode of the invention, the fluid has a critical pressure and the vessel is held under a pressure higher than the critical pressure of the fluid.

In accordance with a concomitant mode of the invention, the fluid has a critical temperature and the atmosphere of the vessel is held at a temperature higher than the critical temperature of the fluid.

Other features that are considered as characteristic for the invention are set forth in the appended claims.

Although the invention is illustrated and described herein as embodied in a method for cleaning a surface of a photomask, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

In the following, the invention will be described in more detail by exemplary embodiments and the corresponding figures. By schematic illustrations that are not true to scale, the figures show different exemplary embodiments of the invention.

FIG. 4 is a diagrammatic block and schematic diagram of a portion of a second embodiment of a device for carrying out the method for cleaning the surface of a photomask according to the present invention; and FIG. 5 is a diagrammatic block diagram of another portion of the second embodiment of the device for carrying out the method for cleaning the surface of a photomask according to the present invention.

DESCRIPTION OF THE PREFERRED EMBODIMENTS

Figure 1:
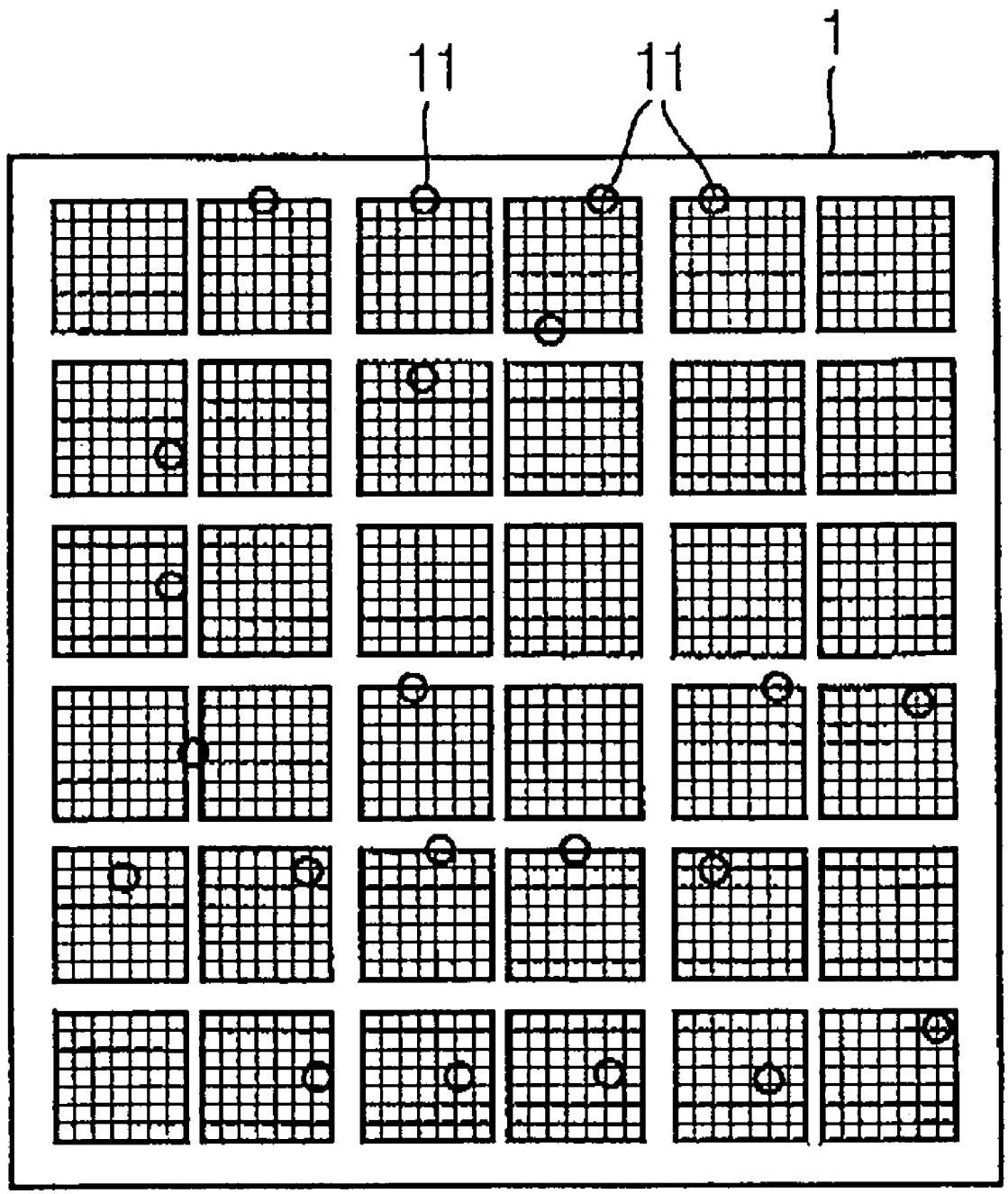
FIG. 1 is a diagrammatic plan view of a photomask that can be cleaned with the method according to the present invention.

Referring now to the figures of the drawings in detail and first, particularly to FIG. 1 thereof, there is shown a photolithographic mask 1, which can be used for photolithographically transferring a predetermined pattern onto a photoresist material that is applied on a semiconductor substrate, for example. As can be seen from FIG. 1, usually, the photomask includes a plurality of patterns that are transferred from the mask to the photoresist material by exposing the photoresist material with light that has been transmitted or reflected by this photomask. In addition, a plurality of contaminants 11 are left on the surface of the photomask.

The person skilled in the art can understand that the method according to the present invention can equally be applied to any kind of a photomask, including reflective or transmissive photomasks, UV, EUV, VES, or other photomasks that are used in other wavelength regions.

As can be gathered from FIG. 1, the presence of contaminants on the surface of such a reticle will cause severe problems because, using one mask, a plurality of wafers is exposed and, consequently, a much greater plurality of chips is made. If the surface of the mask is contaminated, this large amount of chips will be defective.

Figure 2:
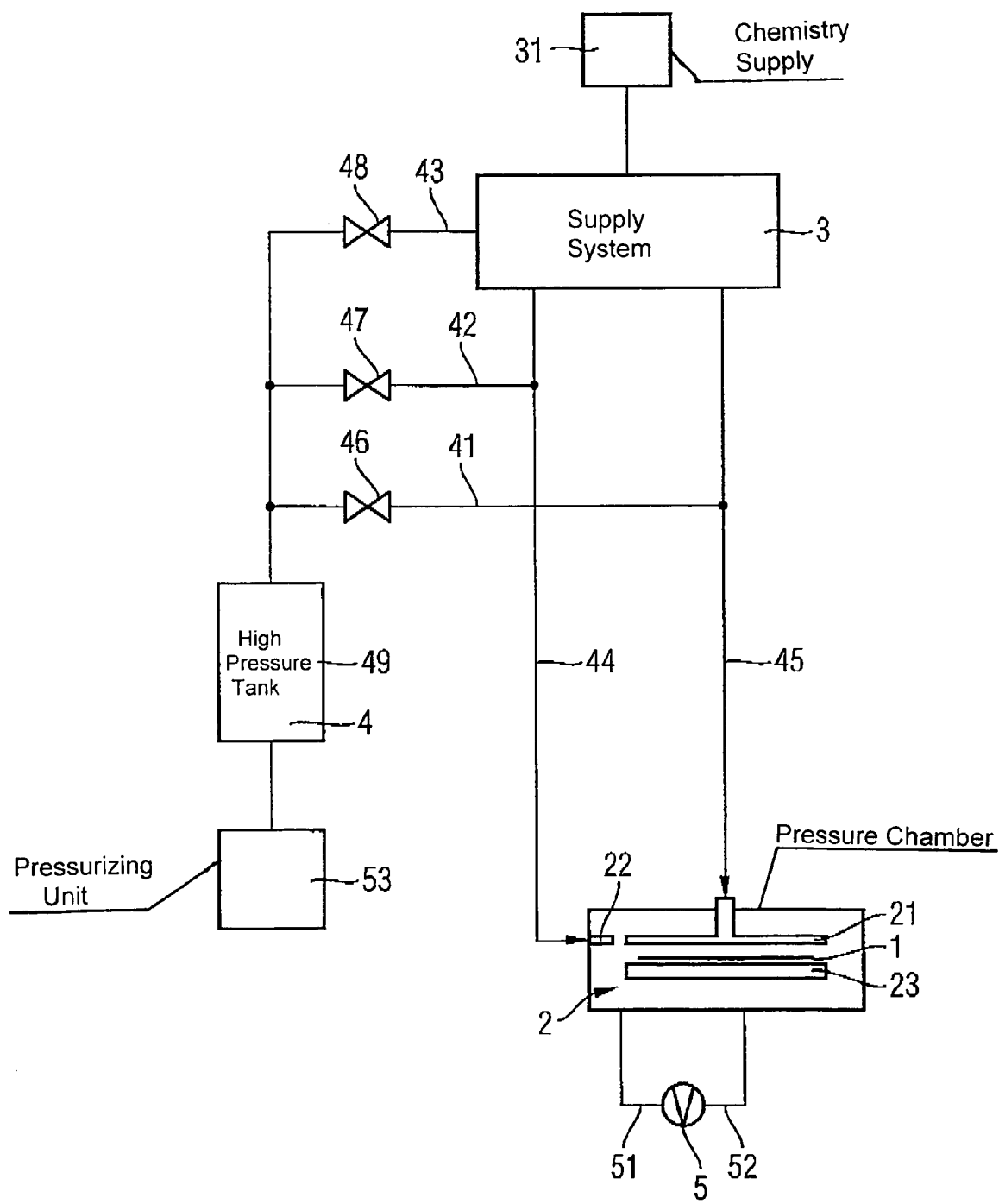
FIG. 2 is a schematic and block circuit diagram of an exemplary device for cleaning a photomask surface using the method of the present invention.

FIG. 2 illustrates an exemplary apparatus that can be used for performing the method of the present invention. In particular, the apparatus shown in FIG. 2 includes a pressure chamber 2 in which the photomask 1 that is to be cleaned is held under an elevated pressure. The apparatus further includes a high pressure tank 4 in which the $CO_2$ is housed. The tank 4 is held at a temperature above the critical temperature of the fluid, such as $CO_2$, in particular, in a range of 32 to 100° C. In addition, the pressure of the fluid in the tank 4 is preferably about 7.386 MPa to 24.161 MPa. In particular, it is beneficial if the pressure of the fluid in the tank 4 is above the critical pressure of the fluid. The pressure of the fluid in the tank 4 is adjusted by the pressurizing unit 53. Lines 41, 42 for directly feeding the supercritical fluid 49 to the pressure chamber 2 are provided. Valves 46, 47 are provided to control the fluid flow. In addition, an outlet line 43 fluidly connects the tank 4 with the supply system 3. The fluid flow of the line 43 is controlled by the valve 48. A chemistry supply 31 is additionally fluidly connected with the supply system 3. For example, an additive such as Isopropyl Alcohol (IPA), water, or any other solvent can be fed from the chemistry supply 31. Outlet lines 44, 45 fluidly connect the supply system with the pressure chamber 2. A vacuum unit 5 is fluidly connected with the pressure chamber 2 through lines 51, 52.

For performing the method of the present invention, a photomask 1 is inserted into the pressure chamber 2 and secured to a substrate holder 23 by usual methods. After closing the pressure chamber 2, air and any other gases in the pressure chamber 2 are evacuated from the pressure chamber 2 using the vacuum unit 5.

Thereafter, the pressure chamber 2 is pressurized with a supercritical fluid 49, in particular, supercritical $CO_2$ from the high pressure tank 4. A preferable pressure of the chamber 2 is 7.386 MPa to 24.161 MPa. Moreover, the atmosphere in the chamber 2 is held at a predetermined temperature, preferably, between 31 and 80° C.

When the predetermined pressure exists in the pressure chamber 2, supercritical $CO_2$ is fed through lines 41 and 45 through a spray member 21 or through a nozzle 22 via lines 42 and 44. One skilled in the art can understand that any other dispensers suitable for supplying the supercritical fluid onto the photomask surface can be used instead of the spray member 21 or the nozzle 22.

Alternatively or additionally, the supercritical fluid 49 can be fed to the supply system 3 and an additive 31 can be mixed therewith before supplying the supercritical fluid 49 to the pressure chamber 2.

The following table presents experimental results obtained when performing the method of the present invention under changing process conditions. In particular, photomasks according to any of Examples 1 to 3 are first subjected to a conventional process of record, which includes a conventional, cleaning process. Thereafter, the cleaning process described above using supercritical $CO_2$ as a solvent is performed, at 80° C. and at a pressure of 180 bar ($1.8 \times 10^7$ Pa), according to Example 1 and Example 2. Moreover, according to Example 1, 5 vol. % Isopropyl Alcohol is added to the supercritical $CO_2$. In contrast, according to the comparative Example 3, no additional cleaning step with supercritical $CO_2$ is performed. After the extraction step with supercritical $CO_2$, no additional cleaning is performed.

| Example No. | Cleaning conditions | Sulfate residuals (ppb) | Ammonia residuals (ppb) |
|---|---|---|---|
| 1 | 80° C./180 bar ($1.8 \times 10^7$ Pa) with 5 vol. % IPA | 1.7 | 1.4 |
| 2 | 80° C./180 bar ($1.8 \times 10^7$ Pa) | 0.33 | 2.8 |
| 3 (comparative) | Without additional cleaning | 3.9 | 4.3 |

As is shown in the table above, the concentration of residuals such as sulfate or ammonia can be greatly reduced with respect to the comparative Example 3 in which no supercritical fluid has been fed to the pressure chamber 2. As can be seen, by feeding 5 vol. % (i.e., % by volume) Isopropyl Alcohol, the ammonia concentration is reduced further. Accordingly, the present invention provides a method by which photomask surfaces can be cleaned very efficiently.

For obtaining optimum results, the flow rate, the process time, the process temperature, as well as the pressure, can be varied.

Figure 3:
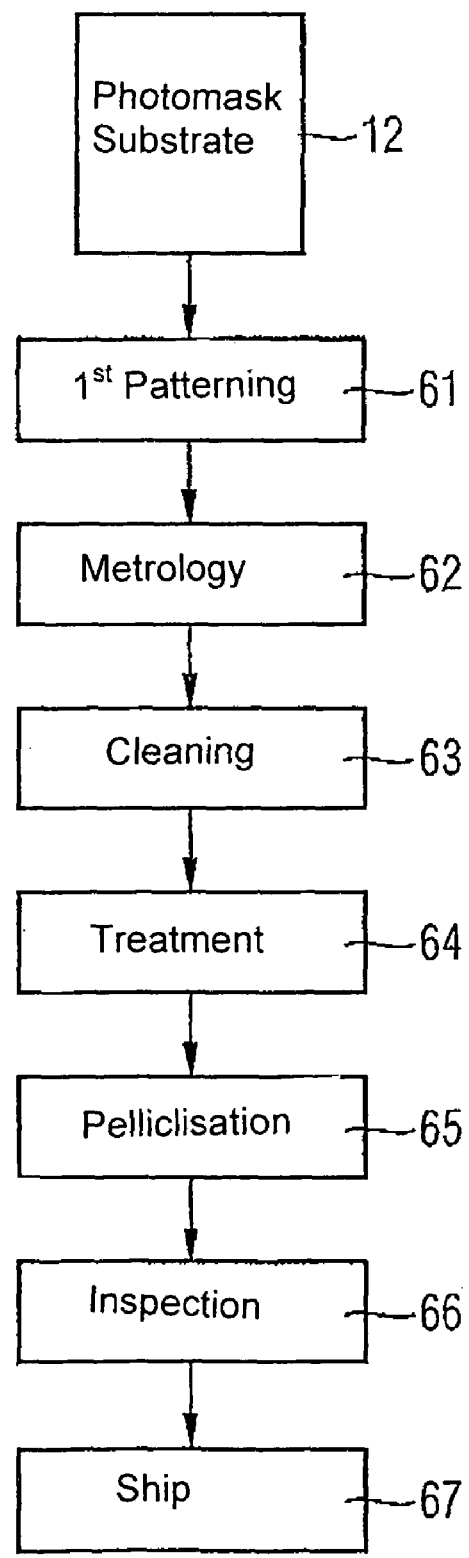
FIG. 3 is a flow chart illustrating a typical process flow starting from a mask substrate to completion of the substrate manufacturing process.

As is shown in FIG. 3, an exemplary sequence of processes during the manufacture of the photomask now can be as set forth in the following text.

Starting from the photomask substrate 12, first a patterning step 61 is conducted for patterning the photomask substrate or layers that are deposited on the surface of the photomask substrate.

Thereafter, a metrology step 62 is performed to ensure that the photomask has desired properties. Thereafter, cleaning steps 63 as are usual can be performed. Then, treatment 64 with the supercritical fluid as has been described above is performed to obtain a thoroughly cleaned photomask surface. In the next step 65, pelliclisation is performed to provide the pellicle on the mask surface in a usual manner. Thereafter, a further inspection step 66 for inspecting the completed photomask is performed. Thereafter, in step 67, the mask is shipped to the wafer fabs, for example.

According to a further embodiment, treatment with the supercritical fluid is performed after exposing the photomask surface to ambient conditions in which a crystal growth will be accelerated.

FIG. 4 shows a device for implementing the method according to a further embodiment of the present invention. In particular, according to this embodiment, the photomask 1 is first placed in the chamber 8 in which a crystal growth on the photomask surface 1a is induced. Thereafter, the grown crystals 81 are removed from the photomask surface 1a by placing the photomask 1 into a pressure chamber 2 (see FIG. 5) and performing the method as has been described above. Accordingly, by the method, crystal seeds can be removed very efficiently from the surface of the photomask 1.

First, this photomask 1 is held by a substrate holder 82, the photomask surface 1a being exposed to the atmosphere. A heating device 84 for directly heating the substrate holder 82 can be disposed at the substrate holder 82. The substrate holder 82 is enclosed by the chamber 8, in which a predetermined pressure can be set by a pump 88. A plurality of gas cylinders 87a, 87b, ..., 87n is provided and are connected with the chamber 8 through gas lines 85a, 85b, ... 85n. The gas flow of a specific gas from the cylinder 87a ... 87n to the chamber 8 can be controlled by a corresponding valve 86a, 86b, ... 86n. A light source 83 is provided to irradiate the photomask surface with light of a specific wavelength. In particular, by irradiating the photomask 1 with light 83a from the light source 83, a reaction of a crystal nucleus with one or more of the gases 89 fed to the chamber 8 will be accelerated or even caused.

For performing the method according to the present embodiment of the invention, a photomask 1 is placed on the substrate holder 82. After optionally setting a predetermined pressure, by feeding appropriate gases to the chamber 8, ambient conditions that are nearly similar to the conditions of a clean room or an exposure tool, for example, are provided. In particular, an active gas such as oxygen ($O_2$), ammonia ($NH_3$) water vapor ($H_2O$) or hydrogen ($H_2$) is fed solely or in combination to the chamber 8. In particular, the active or reactive gas is fed so that a concentration thereof is higher than in normal air and normal clean room air.

By controlling the valves 86a to 86n, the flow rate of each of these active gases can be controlled. In particular, a flow rate of more than 0 to 0.5 l/min ($0.5 \times 10^3$ SCCM, cubic centimeters per minutes under standard conditions) of the active gases is set. In particular, if three active gases are fed to the chamber 8, the sum of the individual flow rates equals to a maximum of 0.5 l/min.

In addition, a carrier gas is fed to the chamber. As a carrier gas, $N_2$ or another inert gas such as argon (Ar), helium (He) or any other noble gas can be fed solely or in combination. The total flow rate of the carrier gases, preferably, is more than 0 to 10 l/min. In addition, the UV lamp 83 is caused to irradiate UV irradiation 83a. The UV lamp 83 can, for example, be a xenon lamp emitting a wavelength of 172 nm.

In particular, it is preferred that the lamp emits a radiation having a wavelength similar to the exposure wavelength of the specific reticle. For example, the wavelength of the UV lamp can be $\lambda_{ex} \pm 20\%$, wherein $\lambda_{ex}$ denotes the exposure wavelength. As an alternative, infrared radiation having an appropriate wavelength to heat the substrate can be irradiated onto the substrate surface. The chamber 8 is held at room temperature of about 22° C. and at a varying pressure. The photomask 1 is held in the chamber with the set conditions as described above for about 10 minutes to induce a crystal growth on the photomask surface.

Thereafter, the photomask 1 is taken from the chamber 8 and placed into the pressure chamber 2. Subsequently, the grown crystals 81 are removed from the photomask by performing the method using the supercritical fluid as has been described above. Due to the high solvent power of the supercritical fluid, the grown crystals 81 will be removed efficiently from the photomask surface 1a.

Under the conditions as described above, the crystal growth will take place on the photomask surface, thus consuming the residuals and the contaminants that have been present originally on the surface of the photomask and that are usually responsible for the crystal growth in the wafer exposure tool. The grown crystal 81 is rinsed from the surface using a supercritical fluid as a solvent. After this process, the mask is free of residuals and contaminants, which are usually the cause of crystal growth and haze.

We claim:

1. A method of cleaning a crystal nucleus from a substrate surface, which comprises:
    setting environmental conditions to cause a relatively accelerated crystal growth from a crystal nucleus to thereby consume residuals and contaminants that were present originally on the surface, the acceleration being with respect to crystal growth under standard clean room and ambient air conditions, the environmental conditions being set by:
       supplying energy inducing crystal growth; and
       feeding at least one reactive gas at a relatively higher concentration than under standard clean room and ambient air conditions, the reactive gas being a gas reacting with the crystal nucleus;
    exposing the substrate surface to the environmental conditions to grow a crystal from the crystal nucleus; and
    removing the grown crystal from the substrate surface by bringing the substrate surface into contact with a fluid in a supercritical state.

2. The method according to claim 1, which further comprises carrying out the energy supplying step by irradiating with light.

3. The method according to claim 2, which further comprises carrying out the light irradiating step with ultraviolet light having a wavelength in a range between approximately 100 nm and approximately 400 nm.

4. The method according to claim 2, which further comprises carrying out the light irradiating step with infrared light having a wavelength of between approximately 800 nm and approximately 1 mm.

5. The method according to claim 1, which further comprises carrying out the gas feeding step with a reactive gas selected from the group consisting of ammonia, water vapor, hydrogen and oxygen.

6. The method according to claim 1, which further comprises carrying out the gas feeding step by feeding the reactive gas at a predetermined flow rate.

7. The method according to claim 1, which further comprises additionally feeding to the substrate surface an inert gas as a carrier gas.

8. The method according to claim 5, which further comprises additionally feeding to the substrate surface an inert gas as a carrier gas.

9. The method according to claim 1, which further comprises setting the environmental conditions to be at a pressure between approximately 10 Pa and approximately $1.013 \times 10^5$ Pa.

10. The method according to claim 9, which further comprises setting the environmental conditions to be at a pressure between approximately 10 Pa and approximately $10^4$ Pa.

11. The method according to claim 1, which further comprises carrying out the grown crystal removing step by bringing the substrate surface into contact with $CO_2$ in a supercritical state.

12. The method according to claim 1, which further comprises adding to the fluid an additive selected from the group consisting of alcohol and water.

13. The method according to claim 1, which further comprises, during the grown crystal removing step, placing the substrate in a vessel held under a pressure elevated with respect to the environment and feeding the fluid to the vessel.

14. The method according to claim 13, wherein the fluid has a critical pressure and which further comprises holding the vessel under a pressure higher than the critical pressure of the fluid.

15. The method according to claim 13, wherein the fluid has a critical temperature and which further comprises holding the atmosphere of the vessel at a temperature higher than the critical temperature of the fluid.

16. The method according to claim 14, wherein the fluid has a critical temperature and which further comprises holding the atmosphere of the vessel at a temperature higher than the critical temperature of the fluid.

17. A method of cleaning a crystal nucleus from a substrate surface, which comprises:

carrying out a cleaning process leaving residuals on the substrate surface;

setting environmental conditions to cause a relatively accelerated crystal growth from a crystal nucleus to thereby consume residuals and contaminants that remain on the surface, the acceleration being with respect to crystal growth under standard clean room and ambient air conditions, the environmental conditions being set by:

supplying energy inducing crystal growth; and feeding at least one reactive gas at a relatively higher concentration than under standard clean room and ambient air conditions, the reactive gas being a gas reacting with the crystal nucleus;

exposing the substrate surface to the environmental conditions to grow a crystal from the crystal nucleus; and removing the grown crystal from the substrate surface by bringing the substrate surface into contact with a fluid in a supercritical state.

* * * * *